(12) United States Patent
Sun

(10) Patent No.: US 6,423,592 B1
(45) Date of Patent: Jul. 23, 2002

(54) PZT LAYER AS A TEMPORARY ENCAPSULATION AND HARD MASK FOR A FERROELECTRIC CAPACITOR

(75) Inventor: Shan Sun, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/893,218

(22) Filed: Jun. 26, 2001

(51) Int. Cl.$^7$ .......................................... H01L 21/8242
(52) U.S. Cl. ............................................ 438/240; 438/3
(58) Field of Search ........................... 438/3, 238, 239, 438/240, 253, 305, 381, 608, 706, 396

(56) References Cited

U.S. PATENT DOCUMENTS

| | | | |
|---|---|---|---|
| 5,254,217 A | 10/1993 | Maniar et al. | |
| 5,561,307 A | * 10/1996 | Mihara et al. | 257/295 |
| 5,864,932 A | 2/1999 | Evans et al. | |
| 5,868,951 A | 2/1999 | Schuck, III et al. | |
| 5,920,453 A | 7/1999 | Evans et al. | |
| 5,936,306 A | 8/1999 | Jeng | 257/751 |
| 5,998,258 A | 12/1999 | Melnick | 438/253 |
| 6,027,947 A | * 2/2000 | Evans et al. | 438/2 |
| 6,037,211 A | 3/2000 | Jeng et al. | |
| 6,080,499 A | 6/2000 | Eastep et al. | |
| 6,090,443 A | 6/2000 | Eastep | 427/255.32 |
| 6,150,184 A | 11/2000 | Evans et al. | |
| 6,174,735 B1 | 1/2001 | Evans | |
| 6,211,542 B1 | 4/2001 | Eastep et al. | |
| 6,281,023 B2 | * 8/2001 | Eastep et al. | 438/3 |

OTHER PUBLICATIONS

"Common and Unique Aspects of Perovskite Thin Film CVD Processes", P.C. Vanbuskirk, et al., ®1998, vol. 21, pp. 273–289.
"Microstructure of epitaxial SrRuO$_3$ thin films on (001) SrTiO$_3$ ", J. C. Jiang, et al., Revised Oct. 8, 1997; Accepted Dec. 23, 1997, http://msewww.engin.umich.edu:81/people/panx/publications/APL SRO 98A/909 1.html, Dec. 6, 2000.
"Novel Magnetism in SrRuO$_3$ ", S.E. Nagler and B.C. Chakoumakos, http://msewww.engin.umich.edu:81/people/panx/publiations/APL SRO 98A/909 1.html, Dec. 6, 2000.
"Magnetoresistance Properties of Thin films of the Metallic Oxide Ferromagnet SrRuO$_3$ ", Steve C. Gausepohl, et al. (Phys. Rev. B52, 3459(1995)), http://erwin.phys.virginia.edu/research/group/lee/abstracts/surruo1.html, Dec. 6, 2000.

* cited by examiner

*Primary Examiner*—Hoai Ho
*Assistant Examiner*—Phuc T. Dang
(74) *Attorney, Agent, or Firm*—William J. Kubida, Esq.; Peter J. Meza, Esq.; Hogan & Hartson, LLP

(57) ABSTRACT

A method of patterning and etching an integrated circuit ferroelectric capacitor uses a layer of PZT which has the same composition as the capacitor PZT as a temporary encapsulation during PZT grain growth annealing. The temporary encapsulation PZT also serves as a hard mask to pattern the top electrode and the capacitor PZT layers for a capacitor-on-oxide structure, i.e., two-layer-one-step patterning. The process of the present invention can also be modified as a three-layer-one-step patterning process and can be applied to a capacitor-on-plug structure.

23 Claims, 8 Drawing Sheets

PZT LAYER AS A TEMPORARY ENCAPSULATION AND HARD MASK FOR A FERROELECTRIC CAPACITOR

BACKGROUND OF THE INVENTION

This invention relates generally to ferroelectric memory circuits, and, more particularly, to a fabrication technique for patterning, etching, and forming a ferroelectric capacitor stack.

Standard Dynamic Random Access Memory (DRAM) and Static Random Access Memory (SRAM) devices are considered volatile memory devices because data stored therein is lost when power is lost. Nonvolatile memory devices are those that can retain data despite loss of power.

At present, there is a strong market for EEPROM (Electrically Erasable, Programmable Read Only Memory), and Flash EEPROM nonvolatile memory devices. These devices tend to be slow to write, often having write times on the order of milliseconds, while read times range generally between one nanosecond and one microsecond. The great difference between read and write times, together with the block-erase character of Flash EEPROM, complicates design of some systems. CMOS SRAM or DRAM with battery backup power for data retention can provide symmetrical, fast, read and write times in nonvolatile memory but is expensive, requires presence of a battery, and limits system life or requires eventual battery replacement.

It is known that Ferroelectric Random Access Memory (FRAM) is a nonvolatile memory technology having potential for both read and write times below one microsecond. FRAM nonvolatile memory devices based on Lead Zirconium Titanate (PZT) ferroelectric storage capacitors as memory elements integrated with CMOS addressing, selection, and control logic are known in the art and are commercially available. PLZT is a Lanthanum-doped form of PZT wherein some of the lead is replaced with Lanthanum, for purposes of this patent the term PZT includes PLZT. It is known that PZT may additionally be doped with strontium and calcium to improve its ferroelectric dielectric properties. Ferroelectric storage capacitors having a Strontium Bismuth Tantalate (SBT) dielectric are also known in the art. For purposes of this patent the term Ferroelectric Dielectric includes both PZT and SBT materials.

It is expected that FRAM devices having smaller device geometries and smaller ferroelectric storage capacitors than currently available devices will offer greater speed and storage density at lower cost. Producing such FRAM devices requires production of well-defined, uniform, high quality, ferroelectric storage capacitors integrated with CMOS addressing and control logic.

Ferroelectric storage capacitors of FRAM devices have a bottom electrode interfacing with a ferroelectric layer, often PZT or SBT, which serves as the ferroelectric dielectric. The ferroelectric layer is typically deposited on top of the bottom electrode, and a top electrode is deposited on top of the ferroelectric layer. These layers are masked and etched to define the size and location of each capacitor. A passivation layer is formed over the resulting capacitors. This layer is masked and etched to allow connection of each capacitor to other components of each memory cell and to other components, such as CMOS addressing, selection, and control logic of the integrated circuit.

A prior process for fabricating an array of ferroelectric storage capacitors is described in U.S. Pat. No. 6,090,443, (the '443 patent) entitled "Multi-Layer approach for optimizing Ferroelectric Film Performance" and assigned to Ramtron International Corporation, Colorado Springs, Colo., the disclosure of which is incorporated herein by reference. This process involves the following steps all performed after deposition of an adhesion layer onto a substrate, the substrate may be a partially processed CMOS integrated circuit wafer:

deposition of a metallic bottom electrode layer;
deposition of a PZT layer;
annealing the deposited PZT; and
depositing a top electrode layer.

Once these layers are deposited, they must be patterned to form an array through at least one masking and etching sequence. Each masking and etching sequence requires deposition of a photoresist over the array of partially processed capacitors, aligning the array with a photomask, exposing, developing, and curing the photoresist, and etching to remove undesired portions of the layers. The etching is controlled by remaining cured photoresist. Etching is typically performed with dry etch techniques, such as plasma etching or ion milling.

It is known that typical dry etch techniques as commonly used in processing capacitor arrays cause damage to the cured photoresist used to control etching. This damage may result in undercutting at edges of resist opening. As cured photoresist layers are eaten away, this damage may also result in undesired etching of those portions of the layers that should remain to form the array.

Typically, fabricating such a capacitor array is performed through a sequence of two or more masking and etching sequences because excessive damage to the photoresist occurs before the undesired portions of the layers are adequately removed. It is known, however, that repeated masking and etching sequences are expensive and can result in undesirable edge profiles of remaining portions as a result of misalignment. The undesirable edge profiles may necessitate greater spacing between capacitor array elements than may be otherwise possible. In particular, it is repeated photomasking operations that drive up cost.

It is also known that exposure of photoresist to dry etch causes release of an assortment of chemical compounds that contain carbon and hydrogen. It is also known that excessive exposure of ferroelectric dielectrics, such as PZT, to these compounds, including hydrogen, can induce undesirable properties in the dielectrics. For this patent, induction of undesirable properties by these compounds is known as photoresist byproduct poisoning of the dielectric. It is therefore desirable to protect the dielectric layer from these chemical compounds during the etching process.

A hardmask is a layer of resistant material that is patterned with photolithographic techniques as known in the art and used to control circuit processing. The resistant material is a material that is more stable than cured photoresist under at least some conditions, these conditions may include etching, diffusing, or oxidizing conditions. Hardmask layers are occasionally used in the processing of integrated circuits; although they are typically formed of nonconductive material. For example, standard CMOS processing uses a nonconductive silicon nitride hardmask layer to protect future diffused areas during field oxidation. U.S. Pat. No. 5,936,306 describes a process utilizing a Titanium Silicide layer as a conductive hard mask for controlling wet etch of titanium nitride. U.S. Pat. No. 5,998,258 discloses a process for forming capacitors having a Barium Strontium Titanate dielectric wherein a hardmask layer of Titanium or Tantalum Nitride is used to pattern a top electrode. Pat. No. 5,998,258 also suggests, in column 4, using a hardmask layer in fabrication of capacitors having PZT ferroelectric dielectric and metallic top electrode.

Further processing details related to the use of hardmasks in ferroelectric memory device processing can be founding in co-pending patent RAM 479, Ser. No. 091797,394.

What is desired, therefore, is a technique for easily patterning, etching, and forming a ferroelectric capacitor stack in a ferroelectric memory that is highly manufacturable and minimizes damage to the ferroelectric dielectric layer of the capacitor stack.

SUMMARY OF THE INVENTION

It is, therefore, a principal object of the invention to provide a fabrication technique for an integrated circuit ferroelectric memory that is both manufacturable, minimizes the number of processing steps, and also minimizes damage to the ferroelectric dielectric layer.

It is an advantage of the present invention that the temporary PZT encapsulation layer prevents capacitor PZT from losing PbO, thus enhancing ferroelectric capacitor performance.

It is another advantage of the present invention that whereas prior art FRAM integration processes require as many as six photo, etch, and photo resist stripping steps for top electrode and capacitor PZT, the process of the present invention is greatly simplified and requires only one photolithographic and one etching step for patterning both the top electrode and capacitor PZT layers.

It is another advantage of the present invention that it reduces the usage of photolithographic resist material, which undesirably generates hydrogen during etching that can degrade capacitor performance.

It is another advantage of the present invention that it eliminates the photolithographic resist residue stripping process found in prior art processes, thus further reducing the integration damage to PZT capacitors.

It is another advantage of the present invention that it prevents the undesirable formation of "fences", or the redeposition of etched materials on sidewalls, that are present in prior art processes.

It is another advantage of the process of the present invention that it can be applied to both the capacitor-on-oxide and capacitor-on-plug devices.

It is a feature of the present invention that the temporary PZT encapsulation layer not only provides a partial barrier to lead out-diffusion (a key consideration in ferroelectric capacitor processing), but is in fact a lead source.

It is another feature of the present invention that the deposition of the PZT encapsulation layer is 'ferroelectric friendly', causing no damage to the underlying ferroelectric capacitor stack, whereas prior art oxide deposition causes severe hydrogen damage to the ferroelectric capacitor that must be annealed out.

It is another feature of the present invention that the temporary PZT encapsulation layer acts as a hydrogen barrier, thus protecting the underlying ferroelectric capacitor during subsequent processing steps, whereas prior art oxide layers provide no such hydrogen protection.

According to the present invention a method of patterning and etching an integrated circuit ferroelectric capacitor uses a layer of PZT that has the same composition as the capacitor PZT as a temporary encapsulation during PZT grain growth annealing. The capacitor PZT is the PZT dielectric layer between the bottom electrode (BE) and the top electrode (TE). The temporary encapsulation PZT also serves as a hard mask to pattern the top electrode and the capacitor PZT layers for a capacitor-on-oxide structure, i.e., two-layer-one-step patterning. The process of the present invention can also be modified for three-layer-one-step patterning for use in a capacitor-on-plug structure.

After the top electrode layer is deposited on a low temperature annealed capacitor PZT layer, a temporary encapsulation layer of PZT that has the same composition as the capacitor PZT is deposited on top surface of the TE. Then the encapsulation PZT is annealed. This anneal also promotes capacitor PZT grain growth. During the anneal, the encapsulation PZT provides lead oxide (PbO) for the capacitor PZT and prevents the capacitor PZT from losing PbO. This process enhances the ferroelectric performance of the capacitor. For the capacitor-on-oxide structure, the TE and capacitor PZT layers are then patterned by one photolithograph/etch step using the temporary encapsulation PZT layer as a hard mask. This patterning process is designated as "two-layer-one-step patterning". For a capacitor-on-plug structure, the TE, capacitor PZT, and BE can be patterned by one photolithograph/etch step due to the temporary encapsulation PZT layer as a hard mask. This is referred to as "three-layer-one-step patterning". Based on the etch rates of photo resist, PZT, TE, and BE, the thickness of encapsulation PZT and photo resist material is selected so that the encapsulation PZT is nearly completely removed when the TE/PZT or TE/PZT/BE etch is completed. Since the photo resist is completely removed during etching, a prior art photo resist residual stripping process is eliminated.

The foregoing and other objects, features and advantages of the invention will become more readily apparent from the following detailed description of a preferred embodiment of the invention which proceeds with reference to the accompanying drawings.

DETAILED DESCRIPTION

Figure 1:
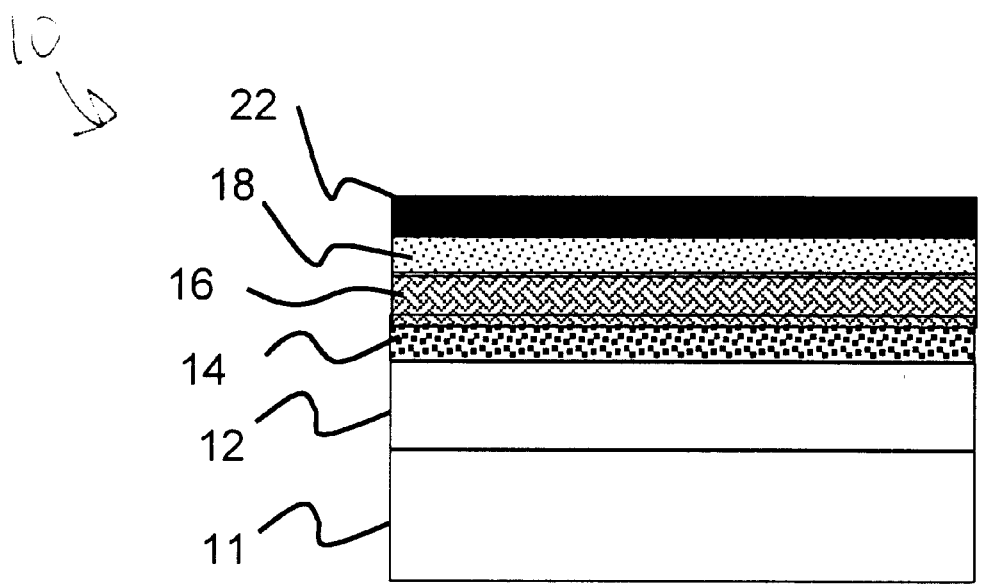
FIG. 1 is a sectional view of a ferroelectric capacitor suitable for use in an integrated circuit ferroelectric memory including substrate, bottom electrode, capacitor PZT dielectric, top electrode, and temporary PZT encapsulation layers.

Referring now to FIG. 1, a first step 10 of a fabrication process according to a first embodiment of the present invention is shown in sectional view. A ferroelectric "capacitor-on-oxide" is formed having an oxide layer 12 about 3000 to 7000 Angstroms thick on top of a silicon or other substrate 11. For example, substrate 11 may be a partially processed CMOS integrated circuit wafer. A hot platinum bottom electrode layer 14 about 1000 Angstroms thick including a 20 nm TiOx adhesion layer is formed on oxide layer 12. The process for forming a hot platinum electrode is described more fully is co-pending patent RAM 467, Ser. No. 09/556,255 which is hereby incorporated by reference. A PZT dielectric layer 16 is formed to a thickness of about 500 to 2000 Angstroms. An iridium oxide top electrode layer 18 is formed to a thickness of about 500 to 2000 Angstroms, and a temporary PZT encapsulation layer 22 is formed to a thickness of about 1000 to 4000 Angstroms. Layer 16 is ideally formed using sputtering at room temperature and annealed at a temperature of about 550° C. for about 90 seconds in a mixture of argon and oxygen. Layer 18 is ideally formed using sputtering at room temperature. Layer 22 is ideally formed using sputtering conditions the same as those for layer 16. The whole stack of layers 11 through 22 is subsequently annealed at a temperature of about 725° C. for 60 seconds in an oxygen atmosphere.

Figure 2:
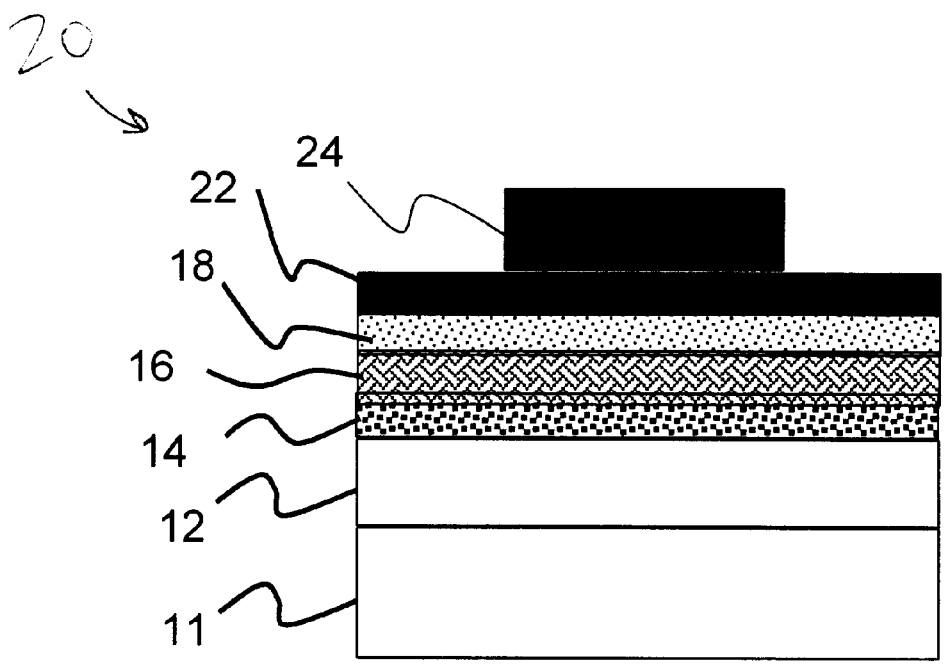
FIG. 2 is the sectional view of FIG. 1 and further including a patterned photo resist soft mask.

Referring now to step 20 shown in FIG. 2, a photoresist layer 24 is coated and patterned to form a soft mask in the manner known in the art of integrated circuit manufacture. Photoresist layer 22 is a standard photoresist material with a thickness of about 7500 Angstroms.

Figure 3:
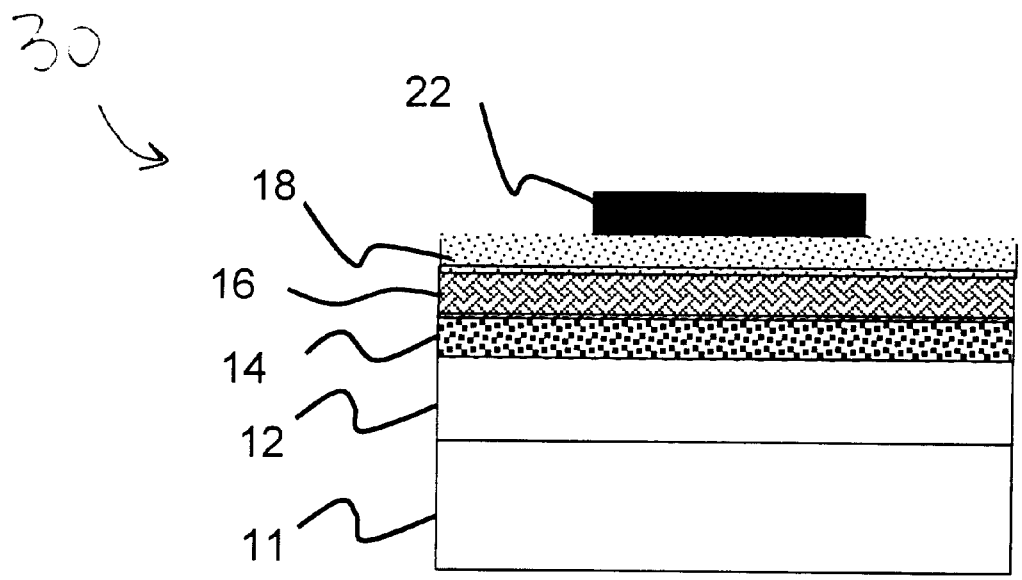
FIG. 3 is the sectional view of FIG. 2 in which the soft mask is completely removed and the temporary PZT encapsulation is patterned to form a hard mask.

Referring now to step 30 shown in FIG. 3, a plasma etch is used to form the hard mask. The soft mask is completely removed during etch and the encapsulation PZT layer 22 is patterned to form the hard mask. The etch machine is fed with a gas mixture of argon and chlorine with a gas flow ratio of 4:1. The etch is performed under 0.3 Pascal of pressure. The etching time is 75 to 155 seconds for layer 22 with a thickness of 1000 to 4000 Angstrom.

Figure 4:
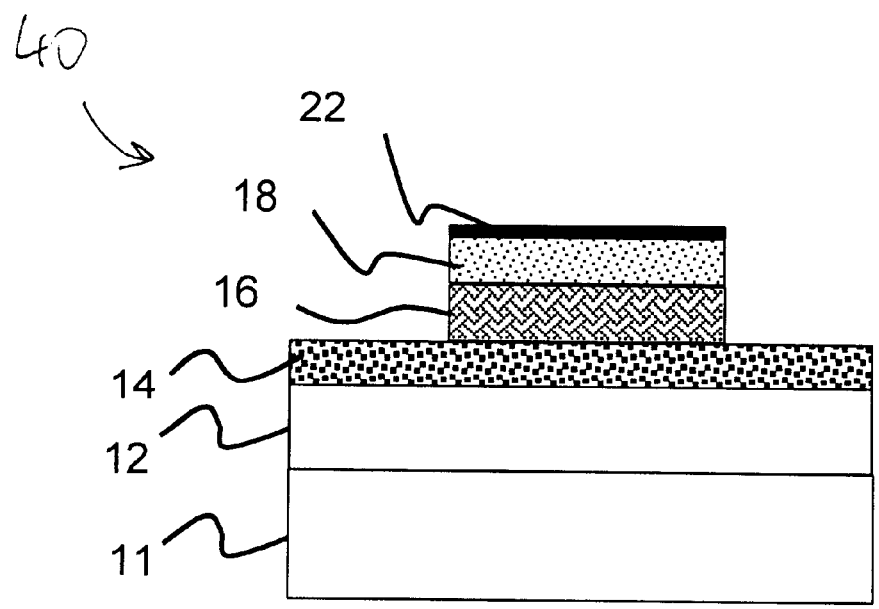
FIG. 4 is the sectional view of FIG. 3 in which the top electrode and capacitor PZT layers are patterned by the hard mask, and the hard mask is nearly completely removed.

Referring now to step 40 shown in FIG. 4, after the hard mask is formed, the etch is continued but the etching conditions are changed to a gas mixture of argon and chlorine with a gas flow ratio of 2:1 and a pressure of 0.5 Pascal to remove undesired portions of layer 18. Once layer 18 is patterned, the etch conditions are changed back to the original conditions to pattern PZT layer 16. The PZT hard mask layer 22 is nearly completely removed by step 40. The final thickness of the hard mask is between 0 and 500 Angstroms. The etch is followed by a post-etch cleaning procedure. The standard clean procedure includes photoresist stripping step followed by a megasonic clean which are known in the art of CMOS integrated circuit processing. It should be noted that no photoresist stripping process is needed in step 40 for the current invention. It should also be noted that the remaining PZT hard mask 22 (0–500 Angstrom) does not need to be striped off since it can be included in the permanent encapsulation layer 26 described below with reference to step 50 shown in FIG. 5.

Figure 5:
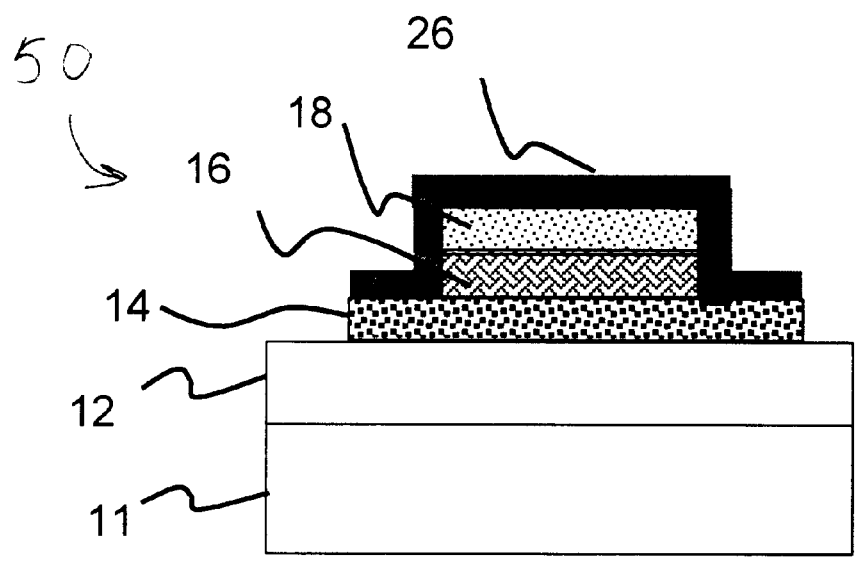
FIG. 5 is the sectional view of FIG. 4 in which a permanent encapsulation layer is deposited and patterned with the bottom electrode layer.

Referring now to step 50 shown in FIG. 5, a furnace anneal is conducted at 650° C. in oxygen for 60 minutes then a permanent encapsulation layer 26 is sputtered having a thickness of about 200 to 1000 Angstrom. The material candidates for layer 26 include, but are not limited to, PZT, alumina ($Al_2O_3$), and $TiO_2$. Once the permanent encapsulation layer 26 is deposited, a common photolithographic and plasma etch process known in the art is used to pattern permanent encapsulation layer 26 and bottom electrode layer 14 to form an encapsulated ferroelectric capacitor stack.

Further processing is continued to mask and etch contact holes in the permanent encapsulation layer 26 including the remaining portion, if any, of the PZT hard mask layer 22 on the top surface of top electrode 18. Further processing is also continued to deposit, mask, and etch the interconnect dielectric, passivation, and metallization layers typical of CMOS integrated circuits to interconnect the resulting ferroelectric capacitor stacks and other components of the circuit to produce a ferroelectric RAM integrated circuit.

Figure 6:
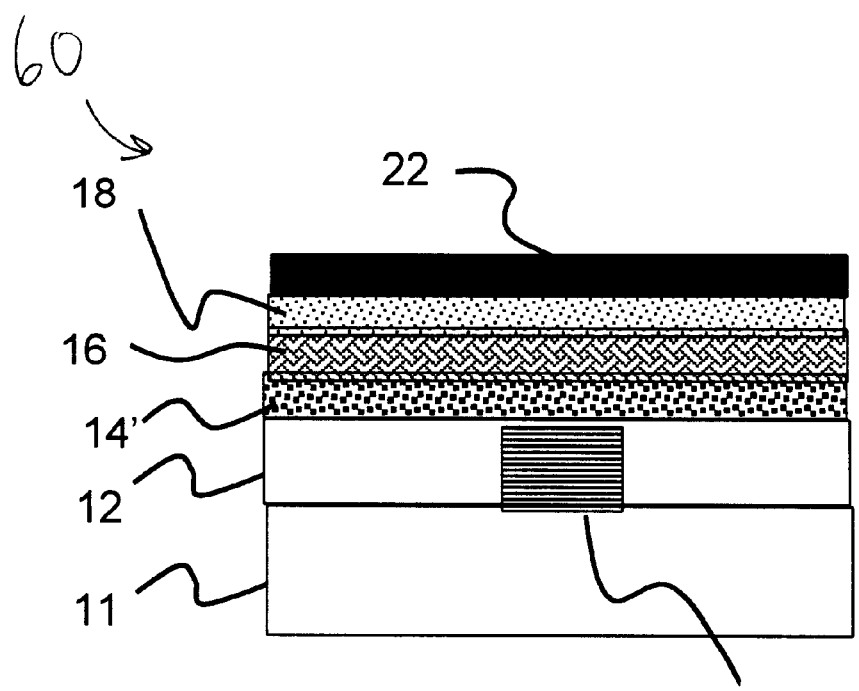
FIG. 6 is a sectional view of a ferroelectric capacitor suitable for use in an integrated circuit ferroelectric memory including a substrate with tungsten plug, a bottom electrode and barrier layer, as well as capacitor PZT dielectric, top electrode, and temporary PZT encapsulation layers.

Referring now to FIG. 6, a first step 60 of a fabrication process according to a second embodiment of the present invention is shown in sectional view. A ferroelectric "capacitor-on-plug" capacitor structure is formed having a tungsten plug 15 in an oxide (BPSG) layer 12 on a CMOS substrate 11, and a bottom electrode layer 14' including a conductive oxidization barrier layer between layers 12 and 14'. The material candidates for the conductive oxidization barrier include, but are not limited to, titanium nitride, $IrO_2$, $Sr_xRu_{1-x}O_3$, $Ti_xAl_{1-x}N$, $Ta_xSi_{1-x}N$, or a combination of these materials. The tungsten plug 15 makes the electric connection between the ferroelectric capacitor and the source/drain area of a N-channel MOS transistor not shown in FIG. 6. Layer 16 is ideally formed using sputtering at room temperature and annealed at a temperature of about 550° C. for about 90 seconds in a mixture of argon and oxygen. Layer 18 is ideally formed using sputtering at room temperature. Layer 22 is ideally formed to a thickness of about 1500 to 4500 Angstroms using sputtering conditions the same as those for layer 16. The whole stack of layers 11 through 22 is subsequently annealed at a temperature of about 725° C. for 60 seconds in an oxygen atmosphere.

Figure 7:
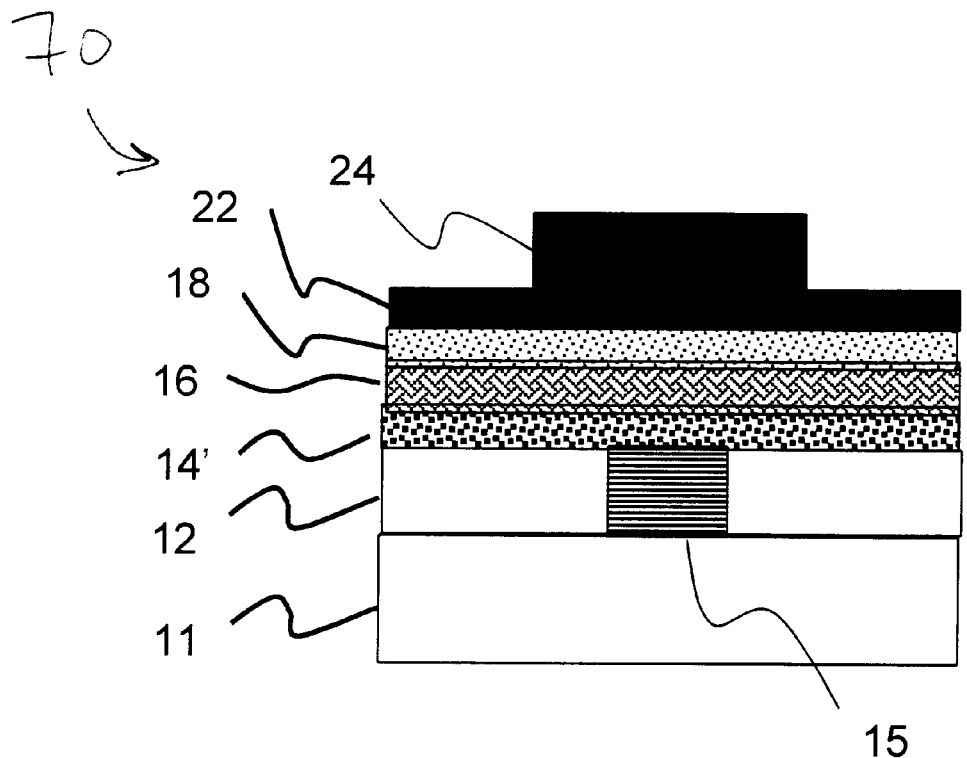
FIG. 7 is the sectional view of FIG. 6 and further including a patterned photo resist soft mask.

Referring now to step 70 shown in FIG. 7, the process of coating and patterning a photoresist layer 24 to form a soft mask is the same as is described regarding step 20 shown in FIG. 2.

Figure 8:
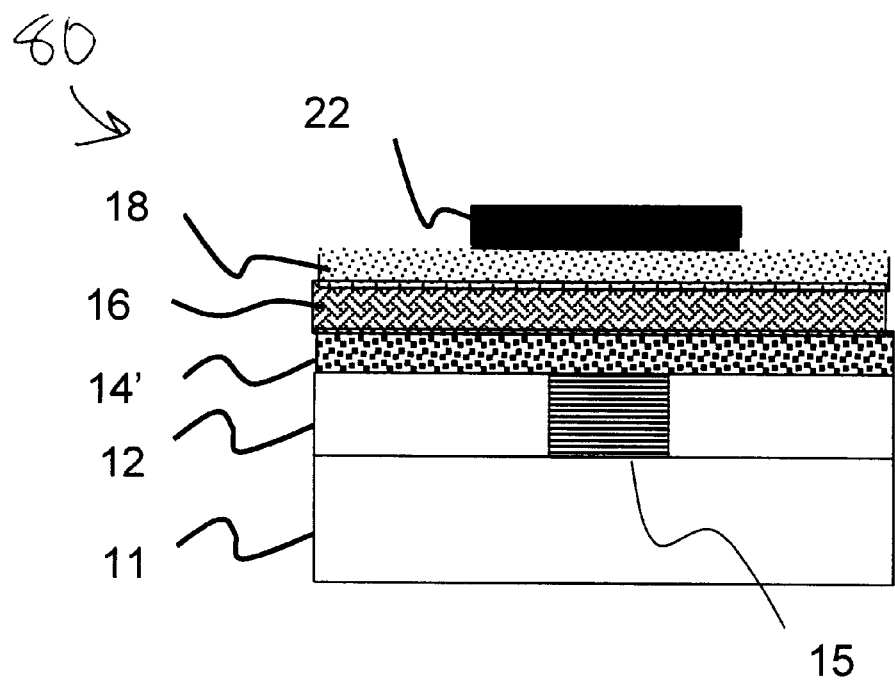
FIG. 8 is the sectional view of FIG. 7 in which the soft mask is completely removed and the temporary PZT encapsulation is patterned to form a hard mask.

Referring now to step 80 shown in FIG. 8, the process of using a plasma etch to form the hard mask is the same as is described regarding step in FIG. 3.

Figure 9:
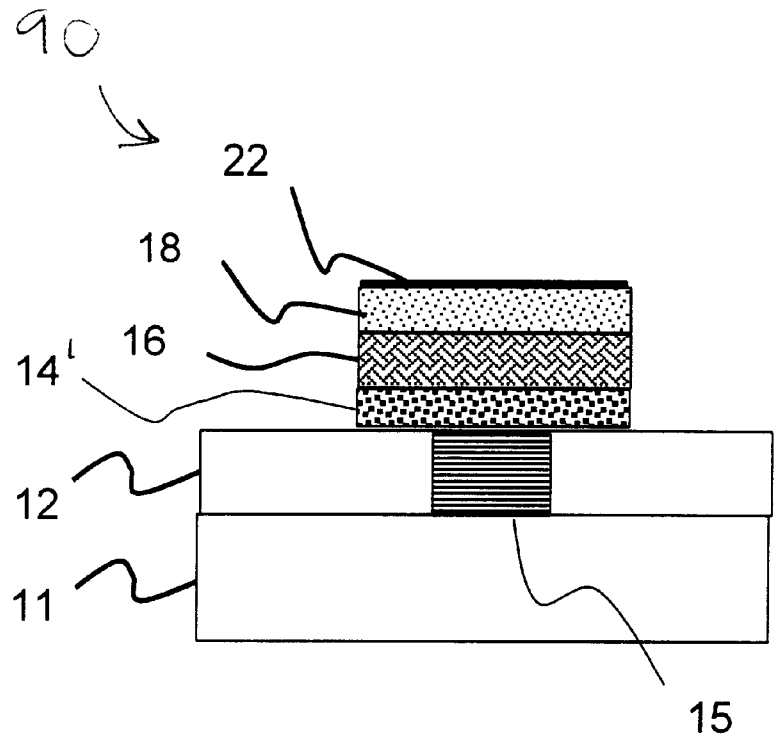
FIG. 9 is the sectional view of FIG. 8 in which the top electrode and capacitor PZT, and bottom electrode layers are patterned by the hard mask, and the hard mask is nearly completely removed.

Referring now to step 90 shown in FIG. 9, the process of patterning the ferroelectric capacitor stack is the same as is described regarding step 40 in FIG. 4, except that once layer 16 is patterned, the etching is continued to pattern layer 14' as well.

Figure 10:
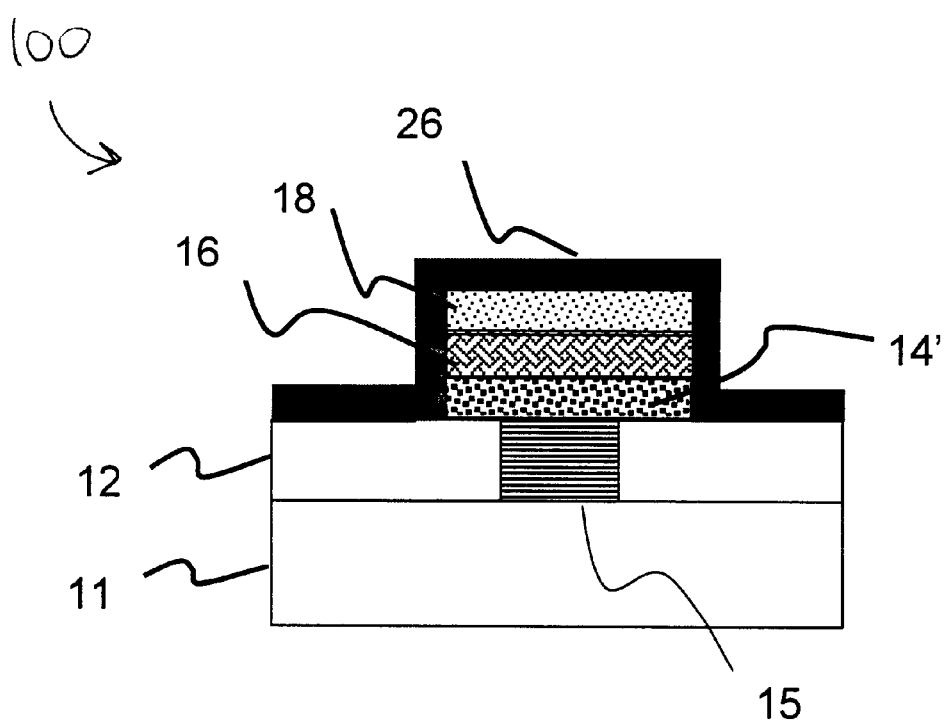
FIG. 10 is the sectional view of FIG. 9 in which a permanent encapsulation layer is deposited.

Referring now to step 100 shown in FIG. 10, a furnace anneal is conducted at 650° C. in oxygen for 60 minutes. A permanent encapsulation layer 26 is subsequently sputtered having a thickness of about 200 to 1000 Angstroms to form an encapsulated ferroelectric capacitor stack.

Processing is continued to deposit interlayer dielectric, planarize the capacitor, mask and etch vias, and to deposit and planarize tungsten plugs. Processing is also continued with a standard double level metal processing with tunsten plugs and aluminum metallization to produce a ferroelectric RAM integrated circuit.

In FIGS. 11–16 data points are shown corresponding to examples of a ferroelectric capacitor built according to the first embodiment of the present invention. Experiments were carried out according to the process procedures described with reference to step 10 through step 50. The thickness of the top electrode layer 18 and PZT dielectric layer 16 was 1500 and 1800 Angstroms, respectively. The thickness effect of the temporary PZT encapsulation layer 22 was measured at 2000, 2500, and 3000 Angstroms. The post-etch clean procedure was also measured by comparing performance with and without the photoresist stripping step. In FIG. 11 through FIG. 16, the ordinate of the plot represents ferroelectric properties or performance indicia, while the abscissa represents three sets of data corresponding to the thicknesses of layer 22 and two data points representing the two post-etch clean procedures. Clean procedure "A" is a standard clean process, i.e., photoresist stripping followed by megasonic clean, while clean procedure B skips the photoresist stripping step. Two wafers were processed for each experiment split and three capacitors on each wafer were electrically characterized. The error bars in the plots represent the standard deviation. All electrical measurements except leakage currents were performed using a standard Sawyer-Tower circuit with a load capacitor as in well known in the ferroelectric testing art. Pulses were generated with an HP 8175A digital signal generator including the optional arbitrary waveform generator. Input waveforms were applied to the bottom electrode of the capacitor under test and output waveforms were measured from top electrode of that capacitor.

Figure 11:
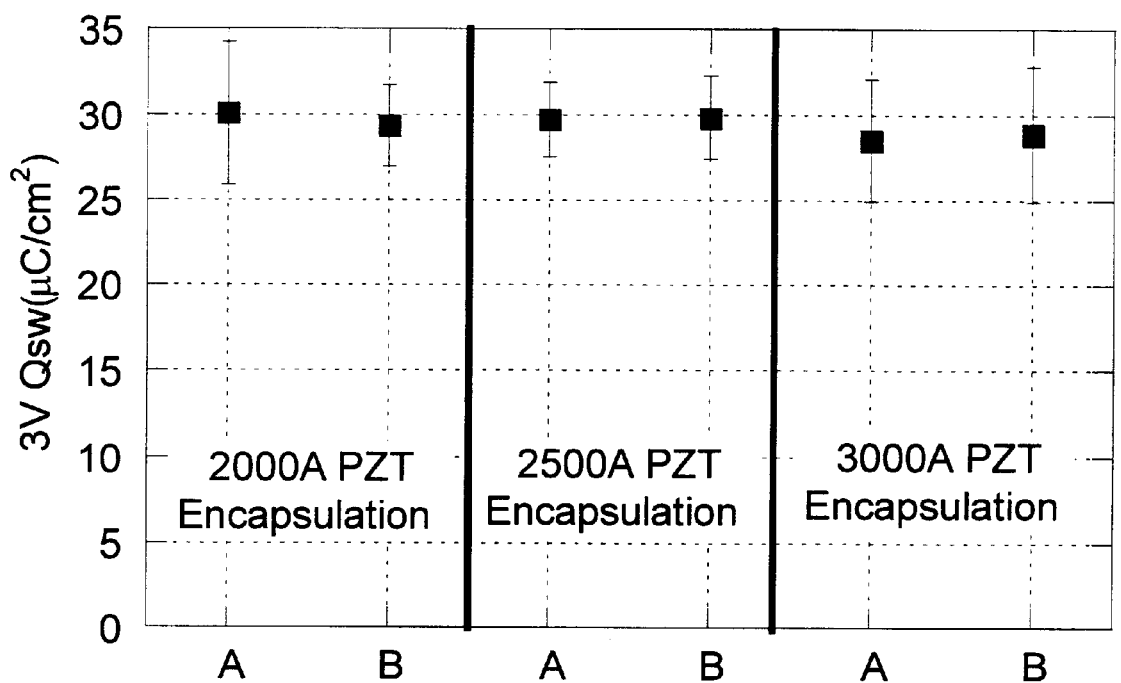
FIG.11 is a plot of switched charge data points measured at three volts for three thicknesses of the temporary PZT encapsulation layer, as well as two post-etch clean procedures.

Referring now to FIG. 11, a plot of switched charge (Qsw) is shown measured at three volts for three thicknesses (2000, 2500, and 3000 Angstroms) of the temporary PZT encapsulation layer 22, as well as two clean procedures. Qsw was measured by pulse switching (1 $\mu$s double-positive pulses followed by double-negative pulses with a one second delay between pulses) and equivalent to 2Pr in hysteresis loop measurements. The plot of FIG. 11 shows that all samples have high Qsw that is well suited for use in switching memory applications.

Figure 12:
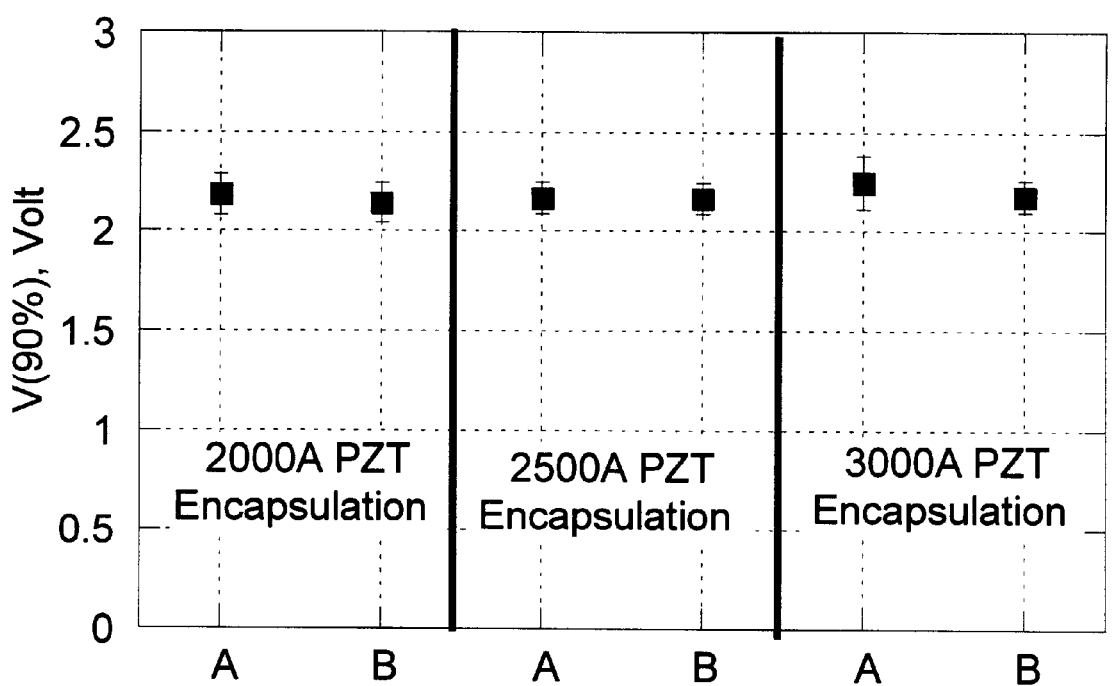
FIG. 12 is a plot of V(90%) data points for three thicknesses of the temporary PZT encapsulation layer, as well as two post-etch clean procedures.

Referring now to FIG. 12, a plot of V(90%) is shown measured for three thicknesses (2000, 2500, and 3000 Angstroms) of the temporary PZT encapsulation layer 22, as well as two clean procedures. V(90%) is defined as the voltage required to achieve 90% of saturated Qsw. The plot of FIG. 12 shows that all samples have a V(90%) about 2.2 volts, significantly and advantageously below three volts. The results indicate that the samples produced by the present invention are well suited for low voltage FRAM products in which the power supply voltage is set at three volts or less.

Figure 13:
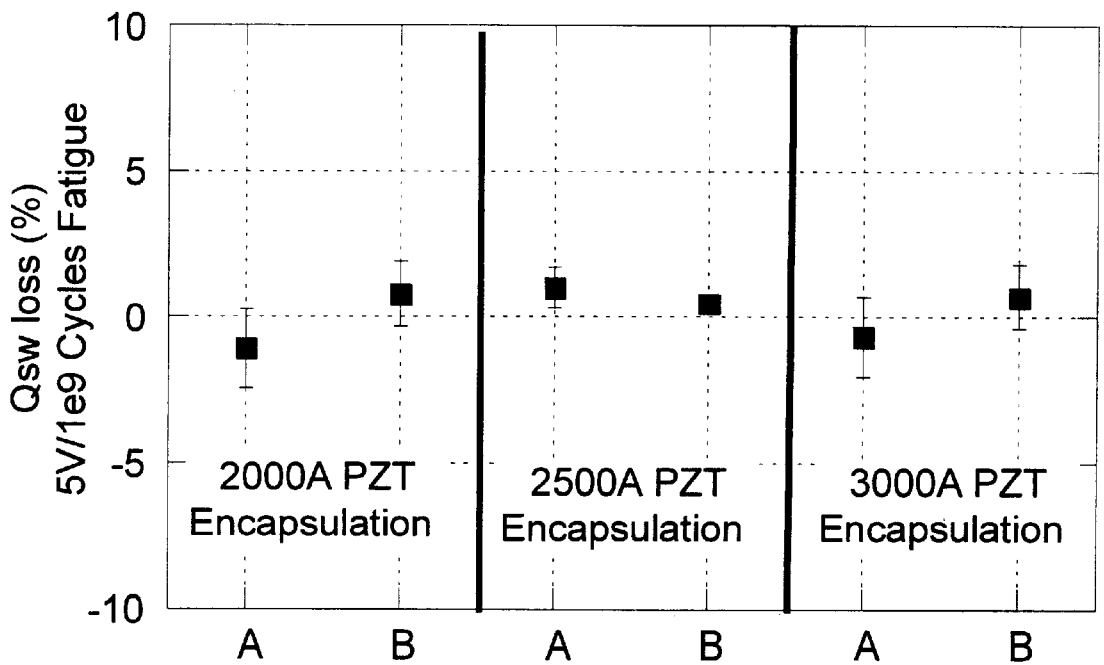
FIG. 13 is a plot of fatigue loss data points measured at five volts and 1E9 cycles for three thicknesses of the temporary PZT encapsulation layer, as well as two post-etch clean procedures.

Referring now to FIG. 13, a plot of five-volt fatigue loss is shown measured for three thicknesses (2000, 2500, and 3000 Angstroms) of the temporary PZT encapsulation layer 22, as well as two clean procedures. Fatigue loss is defined as the amount of Qsw decreased by 1E9 cycles of a five volt test pulse normalized by the initial Qsw value. The plot of FIG. 13 shows that there is virtually no fatigue loss up to 1E9 cycles at five volts, indicating an excellent fatigue resistance at three volts for low voltage FRAM operation.

Figure 14:
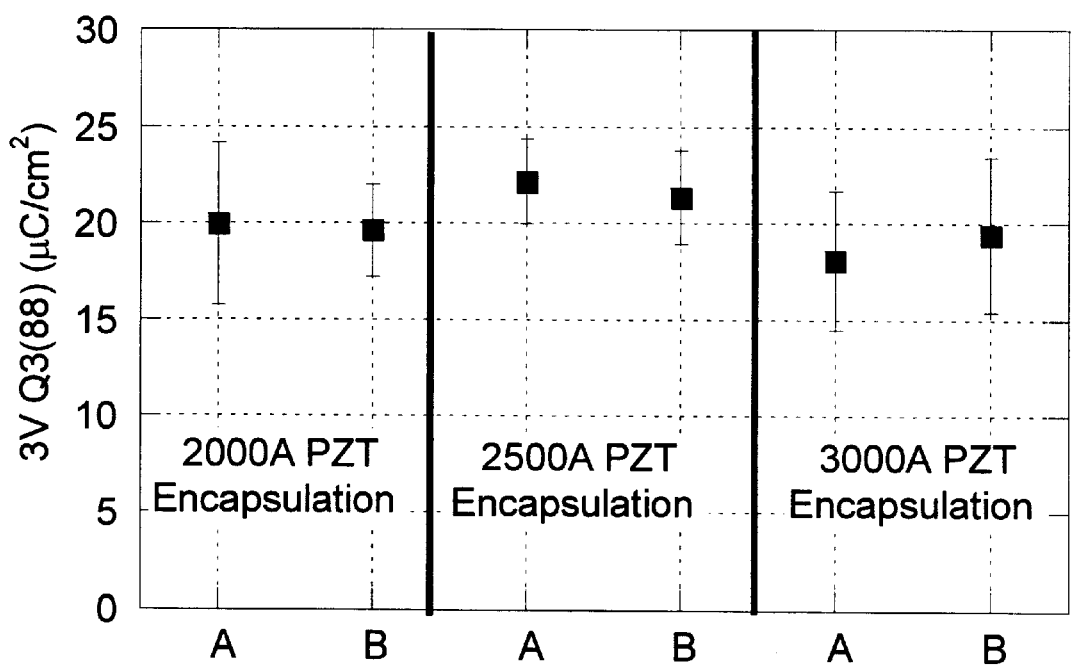
FIG. 14 is a plot of opposite-state switched charge data points measured at three volts for three thicknesses of the temporary PZT encapsulation layer, as well as two post-etch clean procedures.

Referring now to FIG. 14, a plot of opposite-state retention, (Qos(88)), is shown measured for three thicknesses (2000, 2500, and 3000 Angstroms) of the temporary PZT encapsulation layer 22, as well as two clean procedures. Qos(88) is determined by measuring the switchable charges after pairs of capacitors were written into complementary data states at three volts and baked at 150° C. for 88 hours. The plot of FIG. 11 shows that all samples have an acceptable Qos(88) of about 20 $\mu$C/cm$^2$.

Figure 15:
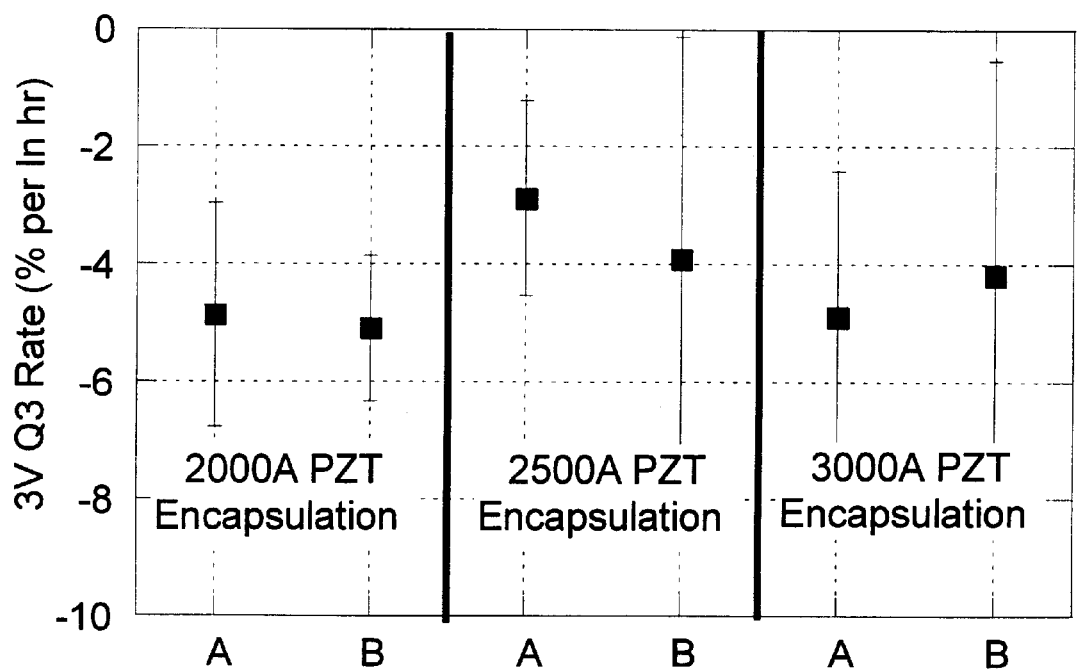
FIG. 15 is a plot of opposite-state switched charge aging rate data points measured at three volts for three thicknesses of the temporary PZT encapsulation layer, as well as two post-etch clean procedures.

Referring now to FIG. 15, a plot of opposite-state retention loss rate, Qos Rate, is shown measured for three thicknesses (2000, 2500, and 3000 Angstroms) of the temporary PZT encapsulation layer 22, as well as two clean procedures. Qos Rate is defined as the rate of change of Qos per natural decade of time in hours. It was determined by the method as described in S. D. Traynor et al., Integrated Ferroelectrics, 1997, Vol. 16 pp. 63–76, which is hereby incorporated by reference. The plot of FIG. 11 shows that all samples have a Qos Rate of about −4% per ln(hrs). The Qos rate proves to be the index of evaluating the memory retention characteristics of a FRAM. Excellent retention characteristics are noted for a large Qos and a small Qos Rate. Combining the Qos(88) and Qos Rate from FIGS. 14 and 15, one can predict that the Qos at 10 years is about 13 $\mu$C/cm$^2$. It is noted that the sensing level of a 2T/2C ferroelectric random access memory is about 5 $\mu$C/cm$^2$. The results indicate that the capacitors have excellent opposite state retention and are well suited for use in ferroelectric memories.

Figure 16:
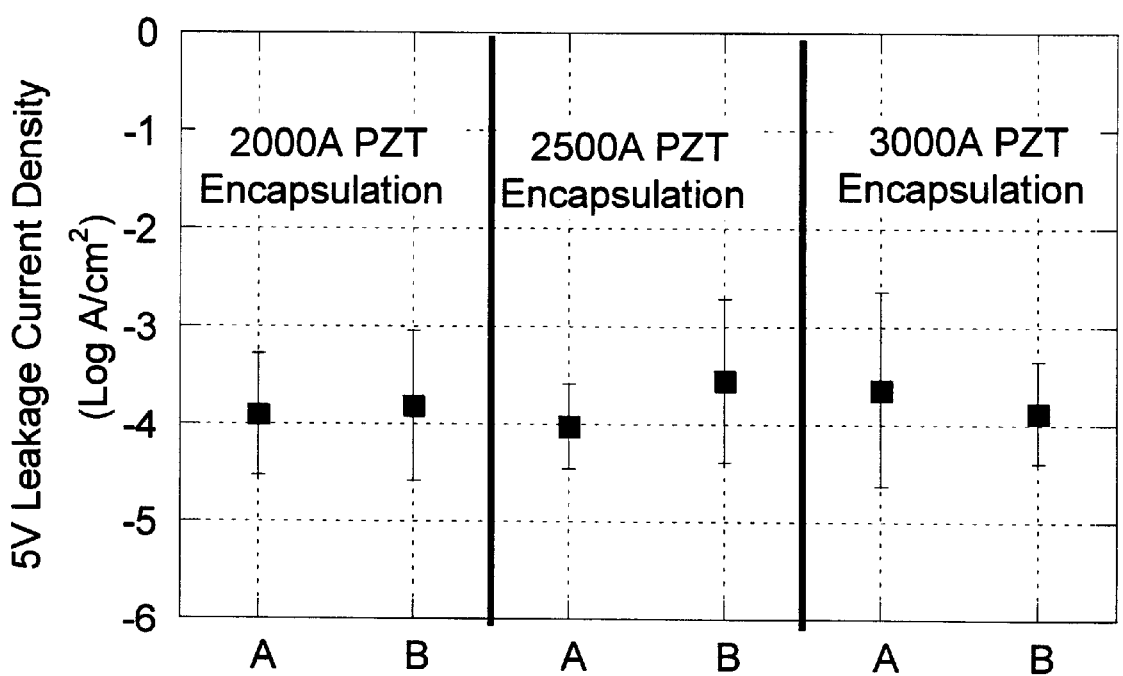
FIG. 16 is a plot of leakage current data points measured at five volts for three thicknesses of the temporary PZT encapsulation layer, as two post-etch clean procedures.

Referring now to FIG. 16, a plot of leakage current is shown measured for three thicknesses (2000, 2500, and 3000 Angstroms) of the temporary PZT encapsulation layer 22, as well as two clean procedures. The leakage current represents the maximum current measured when a ±5 V DC voltage is applied on the capacitor under test. The plot of FIG. 16 shows that all samples have a leakage current of about 1E−3 to 1E−4 A/cm$^2$, which is acceptable for ferroelectric memory applications.

It has been shown, therefore, that the novel process of the present invention exhibits excellent ferroelectric performance, even though the process of the present invention is not yet optimized. The new process of the present invention offers the potential to scale down the capacitor PZT thickness since the encapsulation PZT provides an extra Pb source to reduce or eliminate Pb depletion in the PZT dielectric layer, which has stronger effect on thinner PZT films. The new process of the present invention significantly simplifies the capacitor patterning process by using two-layer-one-step patterning. Further, it is demonstrated that the traditional stripping process is unnecessary. The process of the present invention can be easily modified as a three-layer-one-step patterning process for the next generation of FRAM capacitor-on-plug devices.

Having described and illustrated the principle of the invention in a preferred embodiment thereof, it is appreciated by those having skill in the art that the invention can be modified in arrangement and detail without departing from such principles. For example the ferroelectric material used in the dielectric layer of the capacitor is not limited to PZT, but can include SBT, as well as an SBT temporary encapsulation layer and hard mask. Another example is that the ferroelectric materials deposition process is not limited to a sputtering process, but can include MOCVD and sol-gel spin-on processes as well. All of the thicknesses, temperatures, pressures, and other process variables can of course be changed as desired to optimize a specific implementation of the process of the present invention. I therefore claim all modifications and variations coming within the spirit and scope of the following claims.

I claim:

1. A fabrication method for a ferroelectric capacitor comprising:

providing a substrate;

forming an oxide layer on the substrate;

forming a bottom electrode layer on the oxide layer;

forming a ferroelectric dielectric layer on the bottom electrode layer;

forming a top electrode layer on the ferroelectric dielectric layer;

forming a temporary PZT encapsulation layer on the top electrode layer;

forming a photoresist layer on the temporary PZT encapsulation layer;

patterning the photoresist layer to form a soft mask;

removing the photoresist layer and etching the temporary PZT encapsulation layer to form a hard mask;

removing at least an upper portion of the temporary PZT encapsulation layer and etching the top electrode and ferroelectric dielectric layers;

forming a permanent ferroelectric encapsulation layer on the bottom electrode layers and at least a portion of the ferroelectric dielectric and top electrode layers; and etching the permanent ferroelectric encapsulation and bottom electrode layers.

2. The method of claim 1 in which forming a bottom electrode layer on the oxide layer comprises forming a hot platinum bottom electrode.

3. The method of claim 1 in which forming a ferroelectric dielectric layer on the bottom electrode layer comprises forming a PZT ferroelectric dielectric layer.

4. The method of claim 1 in which forming a top electrode layer on the ferroelectric dielectric layer comprises forming an iridium oxide, iridium, or platinum electrode layer.

5. The method of claim 1 in which forming a temporary PZT encapsulation layer on the top electrode layer comprises forming a PZT encapsulation layer with the same composition as the PZT ferroelectric dielectric layer.

6. The method of claim 1 further comprising annealing the bottom electrode, ferroelectric dielectric, top electrode, and encapsulation layers.

7. The method of claim 6 in which annealing the bottom electrode, ferroelectric dielectric, top electrode, and encapsulation layers comprises annealing at a temperature of about 725° C. for about 60 seconds.

8. The method of claim 6 in which annealing the bottom electrode, ferroelectric dielectric, top electrode, and encapsulation layers comprises in an atmosphere of oxygen.

9. The method of claim 1 further comprising a furnace anneal performed after removing at least an upper portion of the temporary PZT encapsulation layer and etching the top electrode and ferroelectric dielectric layers.

10. The method of claim 9 in which the furnace anneal comprises an anneal at a temperature of about 650° C. for about 60 minutes.

11. The method of claim 9 in which the furnace anneal comprises an anneal in an oxygen atmosphere.

12. A fabrication method for a ferroelectric capacitor comprising:

providing a substrate;

forming an oxide layer on the substrate, including a conductive plug;

forming a conductive oxidization barrier layer on the oxide layer;

forming a bottom electrode layer on the barrier layer;

forming a ferroelectric dielectric layer on the bottom electrode layer;

forming a top electrode layer on the ferroelectric dielectric layer;

forming a temporary PZT encapsulation layer on the top electrode layer;

forming a photoresist layer on the temporary PZT encapsulation layer;

patterning the photoresist layer to form a soft mask;

removing the photoresist layer and etching the temporary PZT encapsulation layer to form a hard mask;

removing at least an upper portion of the temporary PZT encapsulation layer and etching the top electrode, ferroelectric dielectric, and bottom electrode layers; and forming a permanent PZT encapsulation layer on at least a portion of the bottom electrode, ferroelectric dielectric and top electrode layers.

13. The method of claim 12 in which forming a bottom electrode layer on the oxide layer comprises forming a hot platinum bottom electrode.

14. The method of claim 12 in which forming a ferroelectric dielectric layer on the bottom electrode layer comprises forming a PZT ferroelectric dielectric layer.

15. The method of claim 12 in which forming a top electrode layer on the ferroelectric dielectric layer comprises forming an iridium oxide, iridium, or hot platinum electrode layer.

16. The method of claim 12 in which forming a temporary PZT encapsulation layer on the top electrode layer comprises forming a PZT ferroelectric encapsulation layer with the same composition as the PZT ferroelectric dielectric layer.

17. The method of claim 12 further comprising annealing the bottom electrode, dielectric, top electrode, and encapsulation layers.

18. The method of claim 17 in which annealing the bottom electrode, dielectric, top electrode, and encapsulation layers comprises annealing at a temperature of about 725° C. for about 60 seconds.

19. The method of claim 17 in which annealing the bottom electrode, dielectric, top electrode, and encapsulation layers comprises in an atmosphere of oxygen.

20. The method of claim 12 further comprising a furnace anneal performed after removing at least an upper portion of the temporary PZT encapsulation layer and etching the top electrode, ferroelectric dielectric, and bottom electrode layers.

21. The method of claim 20 in which the furnace anneal comprises an anneal at a temperature of about 650° C. for about 60 minutes.

22. The method of claim 20 in which the furnace anneal comprises an anneal in an oxygen atmosphere.

23. The method of claim 12 in which forming a conductive oxidization barrier layer on the oxide layer comprises forming a layer of titanium oxide, iridium oxide, strontium ruthenium oxide, titanium aluminum nitride, or tantalum silicon nitride, or a combination thereof.

* * * * *